(12) United States Patent
Racz et al.

(10) Patent No.: US 10,276,762 B2
(45) Date of Patent: Apr. 30, 2019

(54) OPTOELECTRONIC COMPONENT

(71) Applicant: OSRAM OPTO Semiconductors GmbH, Regensburg (DE)

(72) Inventors: David Racz, Regensburg (DE); Michael Zitzlsperger, Regensburg (DE); Günter Spath, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/509,507

(22) PCT Filed: Sep. 8, 2015

(86) PCT No.: PCT/EP2015/070450
§ 371 (c)(1),
(2) Date: Mar. 8, 2017

(87) PCT Pub. No.: WO2016/038008
PCT Pub. Date: Mar. 17, 2016

(65) Prior Publication Data
US 2017/0263830 A1 Sep. 14, 2017

(30) Foreign Application Priority Data
Sep. 8, 2014 (DE) .......... 10 2014 112 883

(51) Int. Cl.
*H01L 33/58* (2010.01)
*H01L 33/48* (2010.01)
(Continued)

(52) U.S. Cl.
CPC .............. *H01L 33/58* (2013.01); *H01L 33/44* (2013.01); *H01L 33/486* (2013.01);
(Continued)

(58) Field of Classification Search
CPC ....... H01L 33/52; H01L 33/507; H01L 33/48; H01L 25/165; H01L 2924/0002;
(Continued)

(56) References Cited

U.S. PATENT DOCUMENTS 4,739,342 A * 4/1988 Dove .................. B41J 2/43
346/74.2
7,250,715 B2 7/2007 Mueller et al.
(Continued)

FOREIGN PATENT DOCUMENTS

CN 101878540 A 11/2010
CN 102292836 A 12/2011
(Continued)

OTHER PUBLICATIONS

Machine Translation of JP2012124443 A (Kinoshita et al.) "Semiconductor Light-Emitting Device" (Jun. 28, 2012) 18 pages.*
(Continued)

*Primary Examiner* — Caridad Everhart
(74) *Attorney, Agent, or Firm* — Viering Jentschura & Partner MBB

(57) ABSTRACT

An optoelectronic component includes a carrier, and a light source arranged on a surface of the carrier, said light source including at least one luminous surface formed by at least one light-emitting diode, wherein a transparent converter-free spacer is arranged on the luminous surface such that a distance is formed between the luminous surface and a spacer surface of the spacer facing away from the luminous surface, and wherein the light source is potted by a potting compound such that the spacer surface is formed extending flush with a potting compound surface facing away from the surface of the carrier and a surface formed by a spacer surface and the potting compound surface is plane.

14 Claims, 15 Drawing Sheets

(51) Int. Cl.
*H01L 33/50* (2010.01)
*H01L 33/62* (2010.01)
*H01L 33/44* (2010.01)
*H01L 33/54* (2010.01)
H01L 25/075 (2006.01)
H01L 25/16 (2006.01)
H01L 33/56 (2010.01)

(52) U.S. Cl.
CPC .......... *H01L 33/501* (2013.01); *H01L 33/507* (2013.01); *H01L 33/54* (2013.01); *H01L 33/62* (2013.01); *H01L 25/0753* (2013.01); *H01L 25/167* (2013.01); *H01L 33/505* (2013.01); *H01L 33/56* (2013.01); *H01L 2224/48091* (2013.01); *H01L 2224/73215* (2013.01); *H01L 2924/181* (2013.01); *H01L 2933/0025* (2013.01); *H01L 2933/0033* (2013.01); *H01L 2933/0041* (2013.01); *H01L 2933/0091* (2013.01)

(58) Field of Classification Search
CPC ......... H01L 33/44; H01L 33/54; H01L 33/56; H01L 33/62; H01L 33/505; H01L 25/167; H01L 25/0753; H01L 2933/0041; H01L 2933/0091; H01L 33/61; H01L 33/486; H01L 2933/0033; H01L 2924/18161; H01L 33/502; H01L 33/58; H01L 33/501
See application file for complete search history.

(56) References Cited

U.S. PATENT DOCUMENTS

| 2002/0130397 | A1* | 9/2002 | Yew | H01L 23/24 |
| | | | | 257/666 |
| 2005/0184638 | A1 | 8/2005 | Mueller et al. | |
| 2006/0091788 | A1* | 5/2006 | Yan | H01L 33/501 |
| | | | | 313/502 |
| 2010/0065861 | A1 | 3/2010 | Nagai | |
| 2010/0320479 | A1 | 12/2010 | Minato et al. | |
| 2011/0018017 | A1 | 1/2011 | Bierhuizn et al. | |
| 2011/0285003 | A1 | 11/2011 | Itoi et al. | |
| 2012/0119233 | A1 | 5/2012 | Weidner et al. | |
| 2012/0161162 | A1* | 6/2012 | Engl | H01L 25/0753 |
| | | | | 257/88 |
| 2013/0200412 | A1 | 8/2013 | Ramchen et al. | |
| 2013/0207145 | A1* | 8/2013 | Schneider | H04L 33/60 |
| | | | | 257/98 |
| 2013/0293145 | A1* | 11/2013 | Camras | H01L 33/58 |
| | | | | 315/294 |
| 2013/0320384 | A1 | 12/2013 | Liepold et al. | |
| 2014/0027709 | A1* | 1/2014 | Higginson | H01L 23/3171 |
| | | | | 257/13 |
| 2014/0027795 | A1* | 1/2014 | Reiherzer | H01L 33/508 |
| | | | | 257/88 |
| 2014/0048821 | A1* | 2/2014 | Inoue | H01L 33/44 |
| | | | | 257/76 |
| 2014/0117396 | A1 | 5/2014 | Eisert et al. | |
| 2014/0233214 | A1 | 8/2014 | Berben | |
| 2014/0339495 | A1* | 11/2014 | Bibl | H01L 33/504 |
| | | | | 257/13 |
| 2015/0108511 | A1 | 4/2015 | Illek | |
| 2015/0333233 | A1 | 11/2015 | Washizu | |
| 2016/0093777 | A1* | 3/2016 | Sato | H01L 25/167 |
| | | | | 257/98 |
| 2017/0155026 | A1* | 6/2017 | Bergmann | H01L 33/62 |
| 2018/0033931 | A1 | 2/2018 | Ramchen et al. | |

FOREIGN PATENT DOCUMENTS

| DE | 102009036621 A1 | 2/2011 |
| DE | 102011010118 A1 | 8/2012 |
| DE | 102011084406 B3 | 4/2013 |
| DE | 102012206966 A1 | 10/2013 |
| DE | 102012209325 A1 | 12/2013 |
| DE | 102013203350 A1 | 8/2014 |
| EP | 2216834 A1 | 8/2010 |
| JP | 2005244226 A | 9/2005 |
| JP | 2010508669 A | 3/2010 |
| JP | 2012069577 A | 4/2012 |
| JP | 2012124443 A | 6/2012 |
| JP | 2012516026 A | 7/2012 |
| JP | 2012533902 A | 12/2012 |
| JP | 2013534733 A | 9/2013 |
| JP | 2013535111 A | 9/2013 |
| JP | 2013254651 A | 12/2013 |
| JP | 2014090052 A | 5/2014 |
| WO | 2009019836 A2 | 2/2009 |
| WO | 2009069671 A1 | 6/2009 |
| WO | 2010027672 A2 | 3/2010 |
| WO | 2011010234 A1 | 1/2011 |
| WO | 2012156514 A1 | 11/2012 |
| WO | 2013160250 A1 | 10/2013 |
| WO | 2013111542 A1 | 5/2015 |
| WO | 2014104295 A1 | 1/2017 |

OTHER PUBLICATIONS

German Search Report based on application No. 10 2014 112 883.4 (7 pages) dated Jul. 15, 2015 (Reference Purpose Only).
International Search Report based on application No. PCT/EP2015/070450 (4 pages and 2 pages of English translation) dated Dec. 14, 2015 (Reference Purpose Only).
Japanese Office Action based on application no. 2017-513248 (4 pages) dated Jan. 31, 2018 (Reference Purpose Only).
Search report issued for corresponding Japanese patent application 2017-513248, dated Jan. 26, 2018, 15 pages and 15 pages translation (reference purpose only).
Decision of refusal issued for corresponding Japanese patent application 2017-513248, dated August 15, 2018, 3 pages and 3 pages translation (reference purpose only).

* cited by examiner

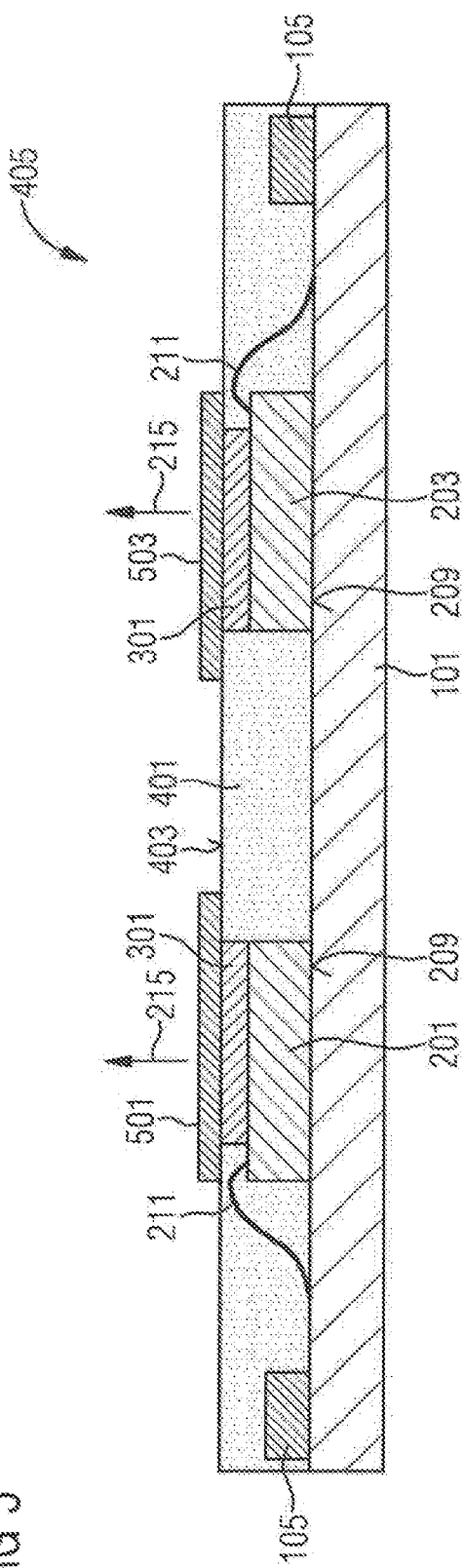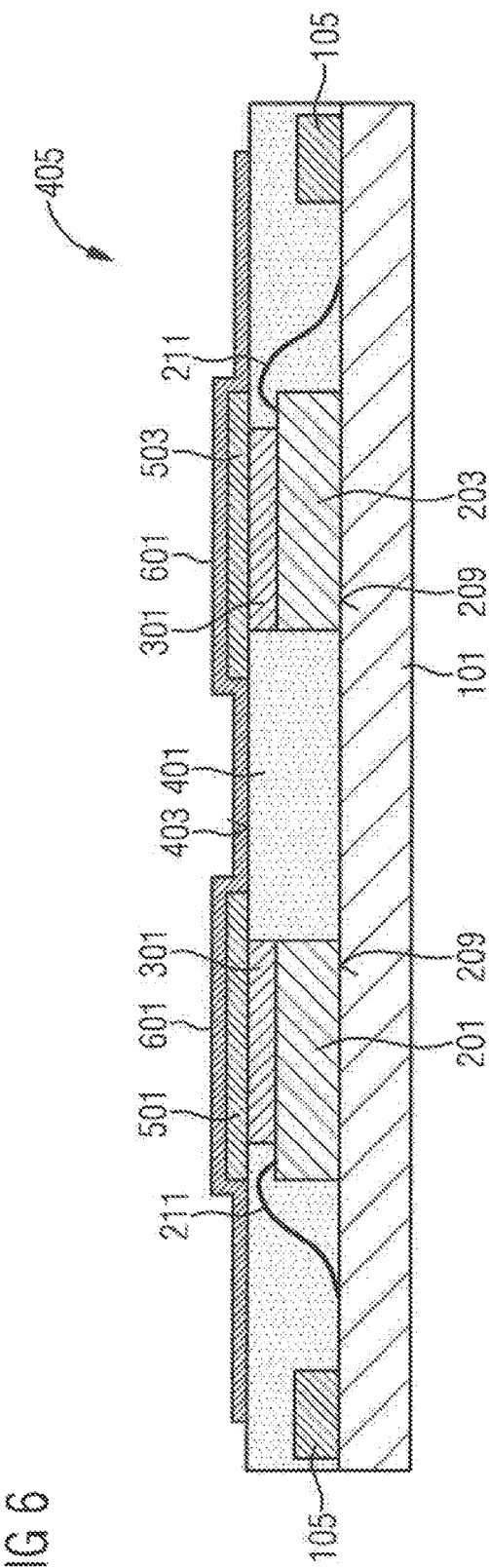

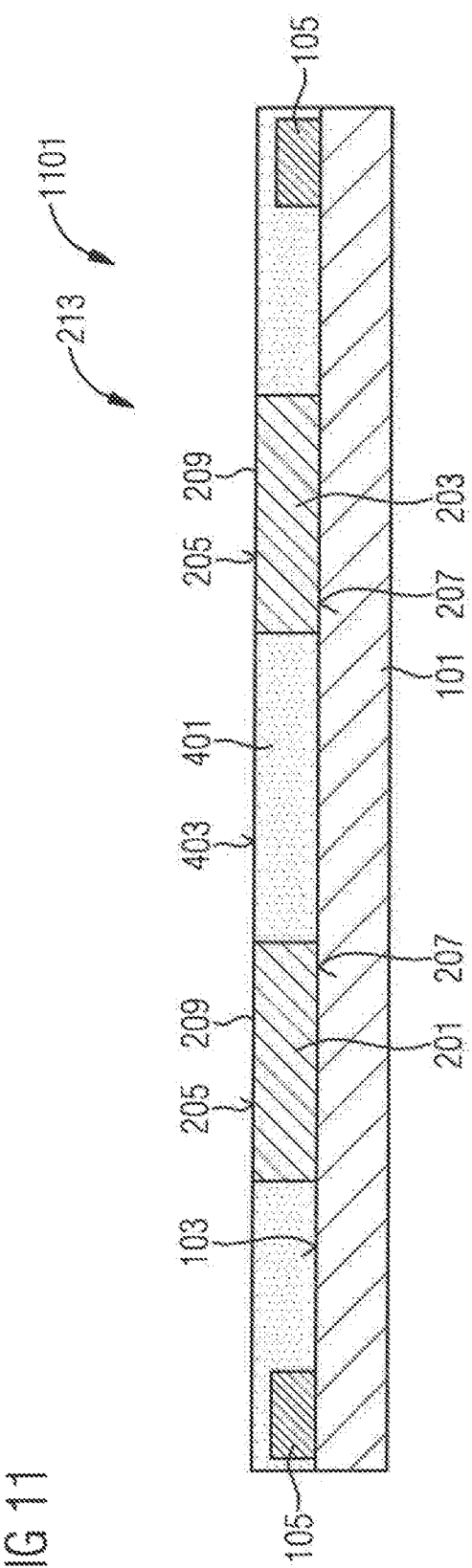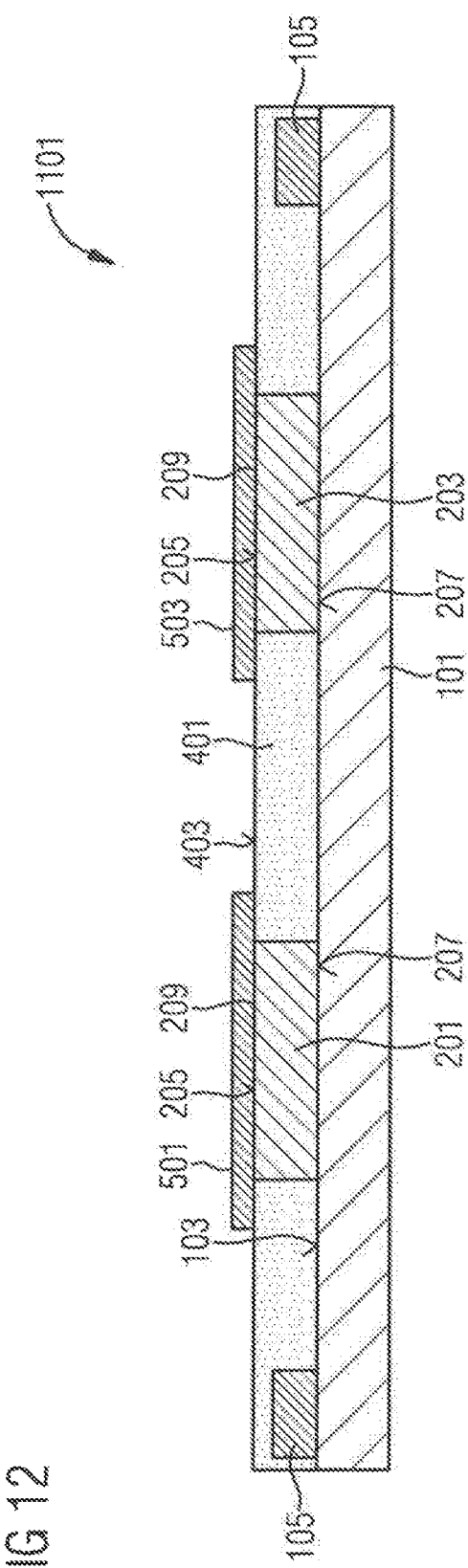

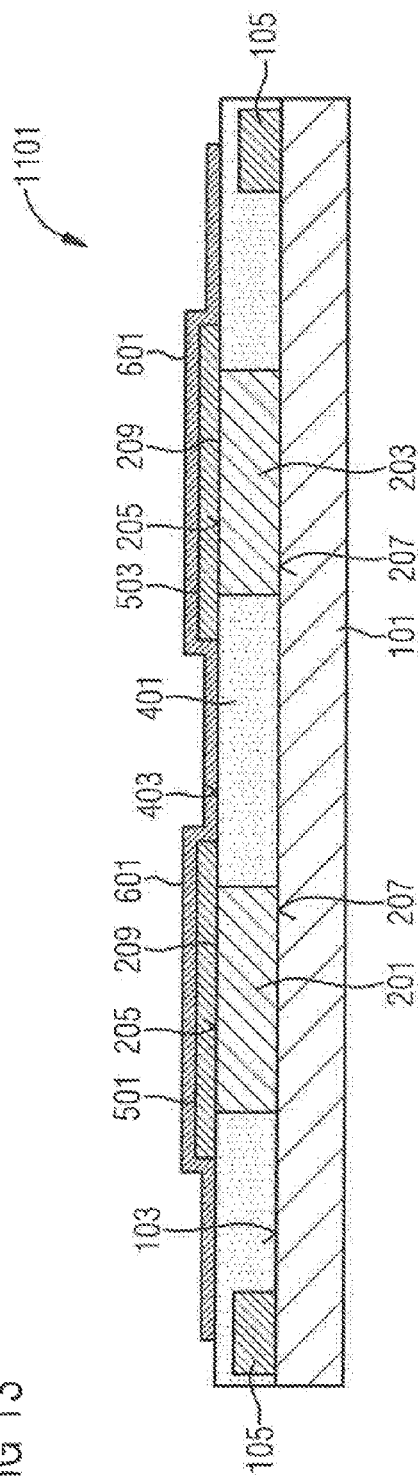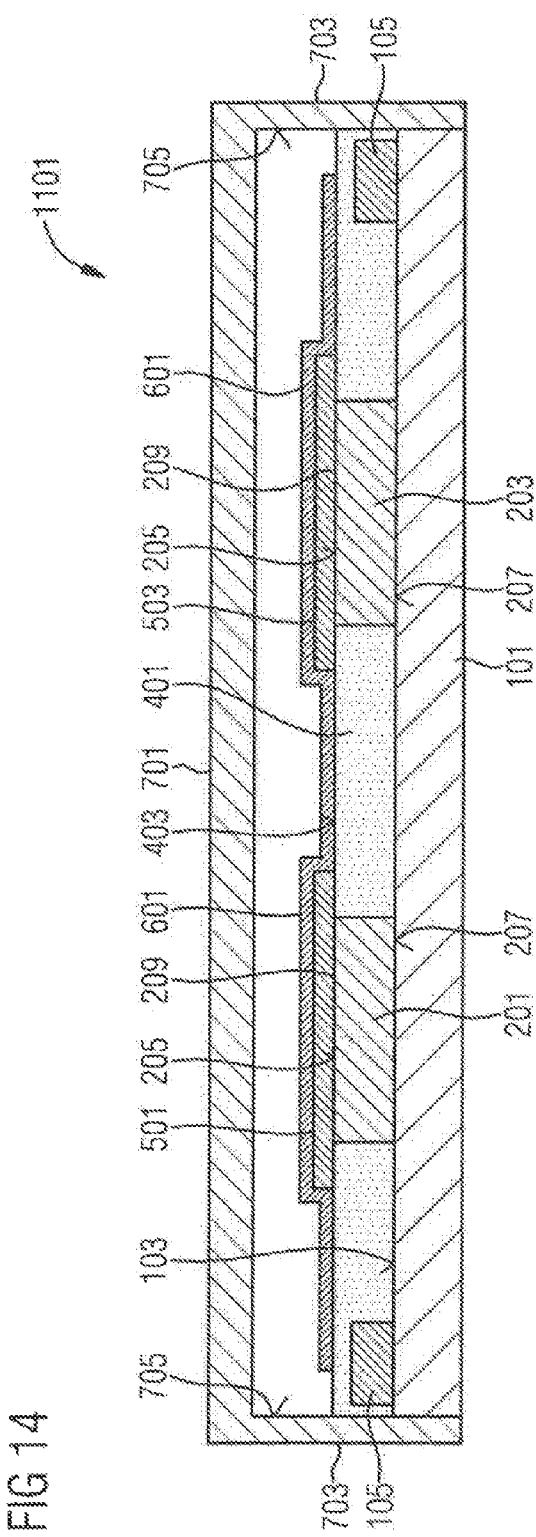

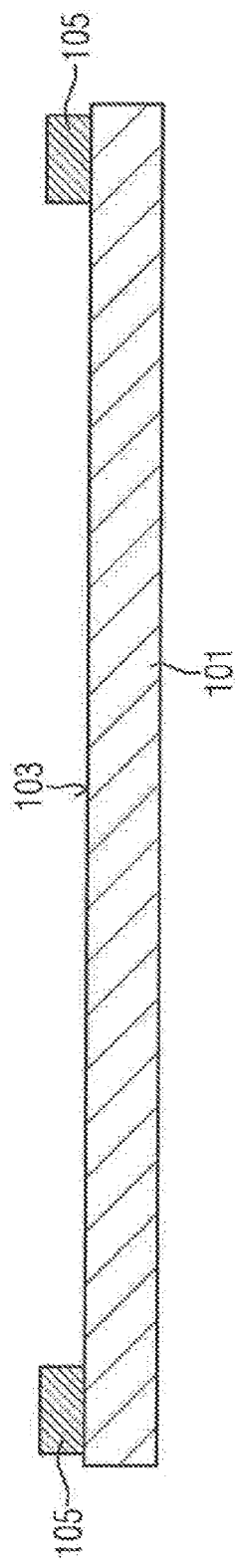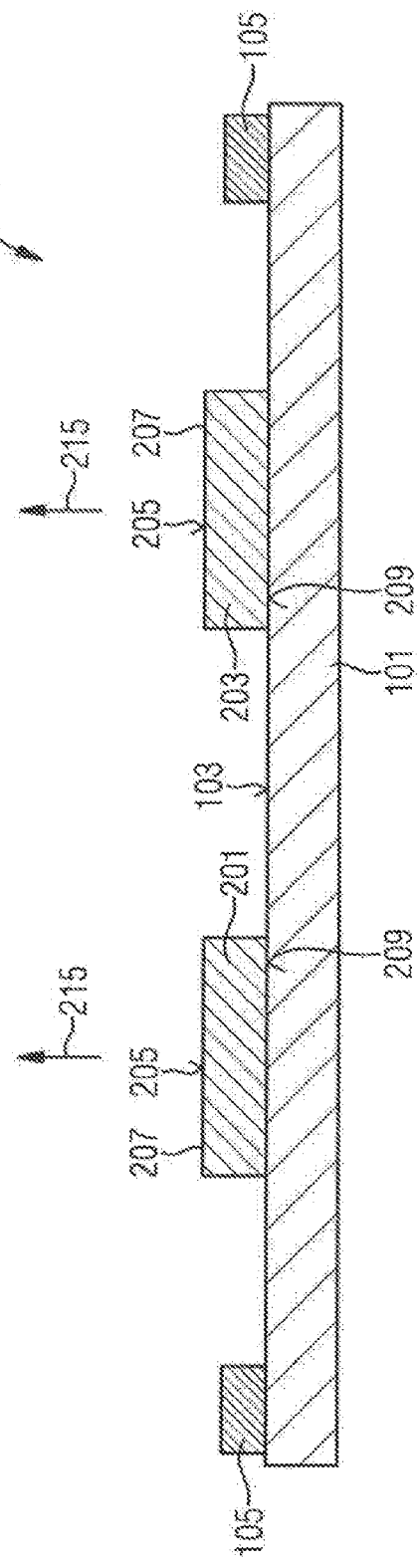

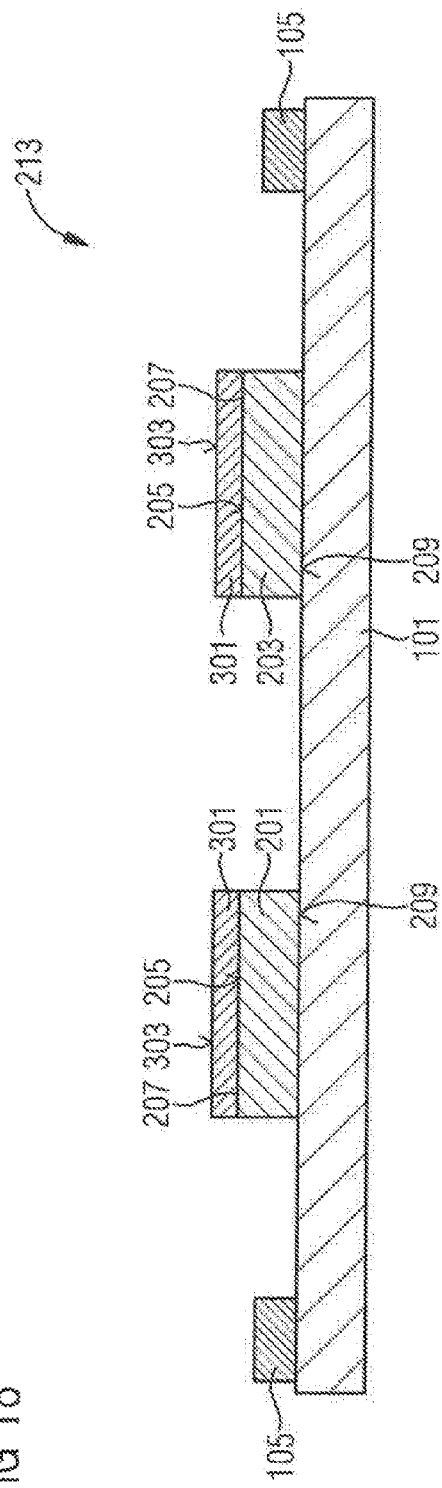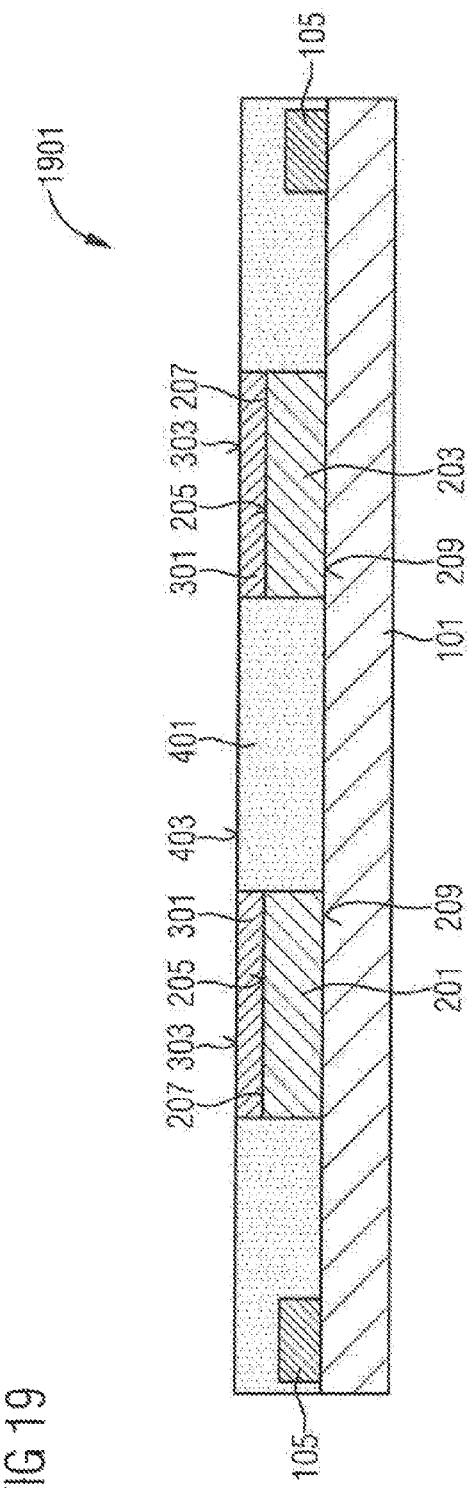

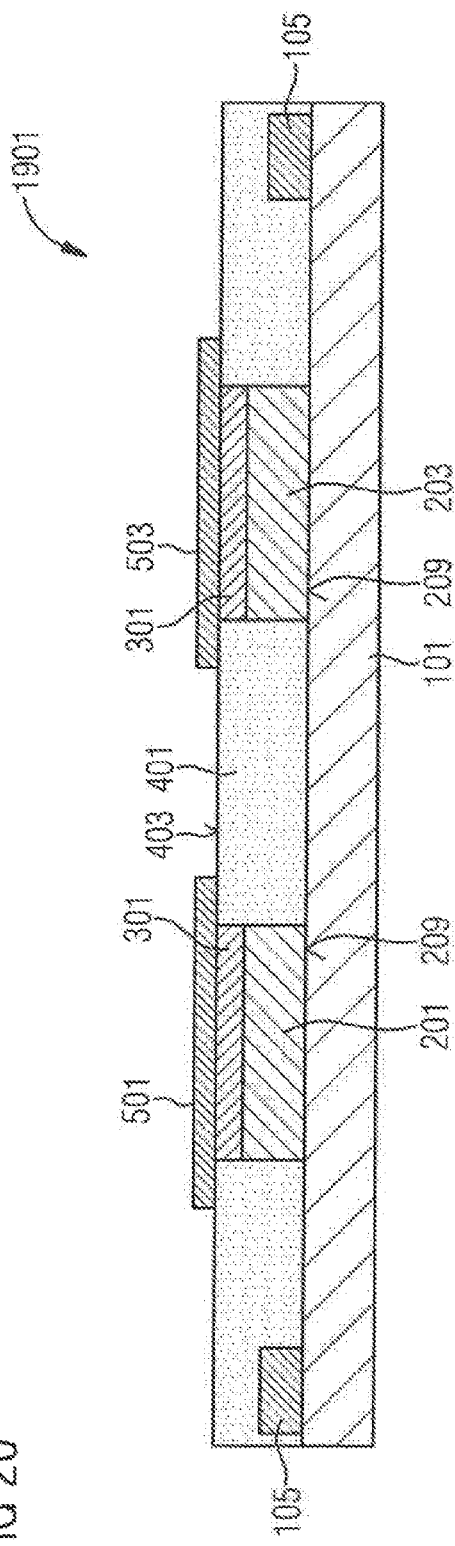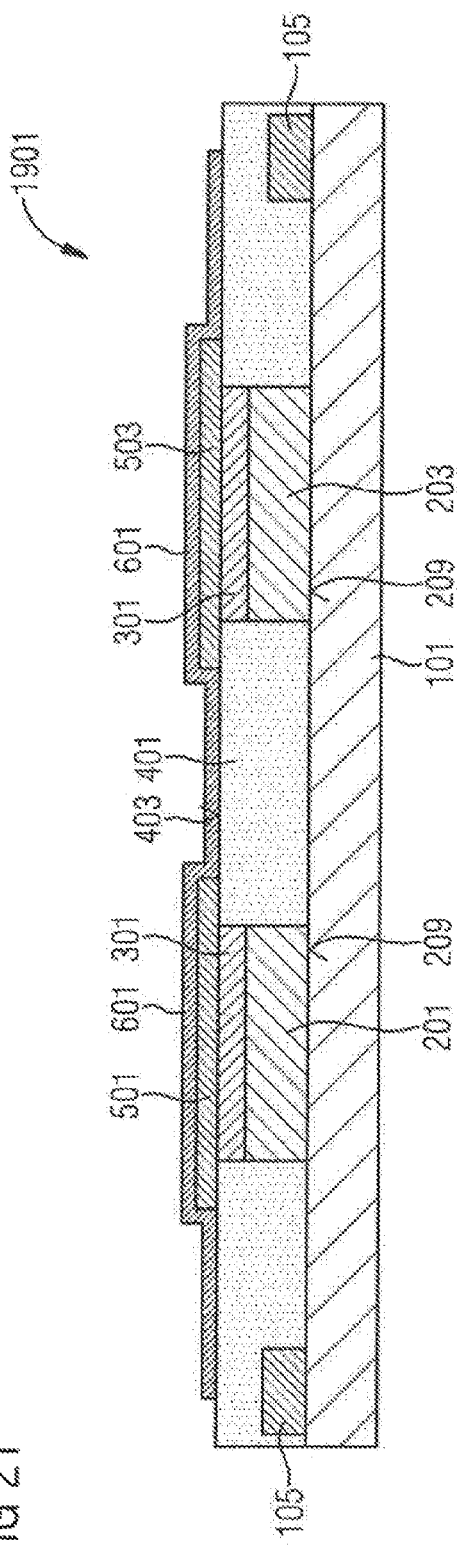

OPTOELECTRONIC COMPONENT

RELATED APPLICATIONS

The present application is a national stage entry according to 35 U.S.C. § 371 of PCT application No. PCT/EP2015/070450 filed on Sep. 8, 2015, which claims priority from German application No. 10 2014 112 883.4 filed on Sep. 8, 2014, and is incorporated herein by reference in its entirety.

TECHNICAL FIELD

Various embodiments relate to an optoelectronic component and a method for producing an optoelectronic component.

BACKGROUND

In addition to the primary electro-optical properties of an LED (light-emitting diode), a requirement arising from the design aspect lies in producing a housing/package which, purely visually, imparts a certain color impression and geometry impression. Specifically, in the case of LED flash modules for cellular telephones, it is often desired to highlight that a plurality of colors (multi-LED) may be displayed.

In particular, there is the requirement of the component imparting the impression of the light-emitting surfaces having a specific form, geometry and color in the switched-off state (off state). Therefore, this also represents a design aspect of the whole cellular telephone.

As a rule, the geometry of the LED chip or the bond wires or the package walls (cavity) restricts the effecting of a specific optical color impression.

The object underlying the present disclosure may therefore be considered that of providing an optoelectronic component which overcomes the known disadvantages and facilitates flexibility in respect of generating a specific optical color impression.

The object underlying the present disclosure may further be considered that of providing a corresponding method for producing an optoelectronic component.

SUMMARY

These objects are achieved by means of the respective subject matter of the independent claims. Advantageous configurations of the present disclosure are the subject matter of respectively dependent subclaims.

According to one aspect, provision is made of an optoelectronic component including a carrier, a light source arranged on a surface of the carrier, said light source including at least one luminous surface formed by at least one light-emitting diode, wherein a transparent converter-free spacer is arranged on the luminous surface such that a distance is formed between the luminous surface and a spacer surface of the spacer facing away from the luminous surface, and wherein the light source is potted by a potting compound such that the spacer surface is formed extending flush with a potting compound surface facing away from the surface of the carrier and a surface formed by the spacer surface and the potting compound surface is plane.

In particular, flush within the meaning of the present disclosure means that a component upper side or the height of the component within close proximity is determined by the spacer. In particular, this means that the spacer predetermines, i.e. limits or restricts, the height of the component. Nevertheless, the surface may possibly have a certain topology due to limitations in the production method (e.g. potting or transfer molding).

In accordance with a further aspect, provision is made of an optoelectronic component including a carrier, a light source arranged on a surface of the carrier, said light source including at least one luminous surface formed by at least one light-emitting diode, and wherein the light source is potted by a potting compound such that a potting compound surface facing away from the surface of the carrier is formed extending flush with the luminous surface and a surface formed by the luminous surface and the potting compound surface is plane.

According to another aspect, a method for producing an optoelectronic component is provided, said method including the following steps: providing a carrier, arranging a light source on a surface of the carrier, wherein the light source includes at least one luminous surface formed by at least one light-emitting diode, arranging a transparent converter-free spacer on the luminous surface such that a distance is formed between the luminous surface and a spacer surface of the spacer facing away from the luminous surface, and potting the light source by a potting compound such that the spacer surface is formed extending flush with a potting compound surface facing away from the surface of the carrier and a plane surface is formed by the spacer surface and the potting compound surface.

In accordance with a further aspect, a method for producing an optoelectronic component is provided, said method including the following steps: providing a carrier, arranging a light source on a surface of the carrier, wherein the light source includes at least one luminous surface formed by at least one light-emitting diode, and potting the light source by a potting compound such that a potting compound surface facing away from the surface of the carrier is formed extending flush with the luminous surface and a plane surface is formed by the luminous surface and the potting compound surface.

Thus, in particular, the present disclosure includes the idea of providing an optoelectronic component including a plane surface which, in one case, is formed by the spacer surface and the potting compound surface and, in another case, is formed by means of the luminous surface and the potting compound surface. Advantageously, a mounting surface which is well-suited and efficiently suited to mounting one or more further elements is formed on account of this plane surface. By way of example, such a further element may be a converter layer, a color scattering layer, an optical element, e.g. a lens, or a lens holder. The plane surface means that the geometry and structure of the carrier surface, including the elements arranged thereon, such as e.g. the light-emitting diode or further electronic components, are no longer restricting in respect of options for ensuring a specific optical color impression of the component. In particular, the geometry and the structure of the carrier surface are no longer restricting when mounting the aforementioned elements.

The provision of the spacer further additionally brings about the technical advantage of this forming a distance between the luminous surface and the potting compound surface such that room or space is provided for elements situated in the surroundings of the luminous surface: for example a bond wire for electrically contacting the light-emitting diode. Therefore, the embodiment including the spacer is particularly suitable for light-emitting diodes which are electrically contacted on the upper side thereof. The embodiment without the spacer is particularly suitable for light-emitting diodes which are electrically contacted from the lower side thereof. The lower side is the side of the light-emitting diode facing away from the luminous surface.

The spacer being converter-free means, in particular, that the spacer does not have conversion properties, i.e. does not include a conversion function. Thus, this means, in particular, that light radiating through the spacer is not converted.

Within the meaning of the present disclosure, transparent means, in particular, that the spacer is transparent to light emitted by means of the light-emitting diode, i.e. has a degree of transmission of at least 85% for the wavelength corresponding to this light. According to one embodiment, the methods according to the present disclosure for producing an optoelectronic component are corresponding methods for producing the optoelectronic component according to the present disclosure.

According to one embodiment, potting includes molding.

Within the meaning of the present disclosure, molding denotes transfer molding, in particular film-assisted transfer molding. That is to say, a transfer molding method, in particular a film-assisted transfer molding method forms the basis of the molding. This is in contrast to a conventional potting process, in which no homogeneous and plane surface is able to arise. At the same time, the electronic components (diode, chips, NTC sensor, further electronic components) and further components may be completely embedded during transfer molding, in particular during film-assisted transfer molding. In the process, a defined and smooth surface arises in an advantageous manner. By way of example, if sealing is carried out on the chip surface by means of the film, the encapsulating material (the potting compound) is also at the same level.

In one embodiment, provision is made for the spacer to be embodied as an electric insulator. Hence, the spacer has an electrically insulating embodiment. In particular, this brings about the technical advantage of the spacer being able to electrically insulate the luminous surface.

In one embodiment, provision is made for the spacer to be embodied projecting beyond an electrical contacting of an upper side of the light-emitting diode facing away from the surface of the carrier. That is to say, the spacer projects beyond an electrical contacting of the upper side of the diode. That is to say, the spacer has a greater height than the electrical contacting relative to the upper side of the diode. By way of example, this brings about the technical advantage of the electrical contacting being completely potted on account of the flush potting. By way of example, the electrical contacting includes a bond wire.

According to one embodiment, provision is made for a converter layer at least partly covering the luminous surface to be arranged on the surface. In particular, this brings about the technical advantage of being able to convert the spectrum of the light emitted by means of the light-emitting diode into a spectrum that differs therefrom. Thus, for example, the diode may radiate or emit blue light which is converted into e.g. green, red or yellow light by the converter layer. In particular, the converter layer completely covers the luminous surface.

According to another embodiment, provision is made for a converter layer which leaves the luminous surface open to be arranged on the surface. In particular, this brings about the technical advantage of facilitating a specific optical color impression of the component without the light emitted by means of the diode being converted. Thus, in particular, the optical color impression is brought about or caused by means of the color of the converter layer.

According to one embodiment, provision is made of a plurality of converter layers which are arranged on the surface in a manner at least partly covering the luminous surface (i.e., some converter layers at least partly cover the luminous surface) and/or which are arranged on the surface leaving the luminous surface open (i.e., some converter layers do not cover the luminous surface). Thus, this advantageously brings about both a conversion and a specific optical impression of the component due to the converter layer which leaves the luminous surface open.

According to a further embodiment, provision is made for the converter layer to be produced by screen printing or by potting. In particular, this brings about the technical advantage of facilitating a simple production of the converter layer by known methods.

In accordance with a further embodiment, provision is made for a color scattering layer for creating a color by scattering light at a color scattering layer surface of the color scattering layer facing away from the surface to be arranged on the converter layer. As a result, this brings about the technical advantage of, in particular, facilitating a color impression corresponding to the color scattering layer independently of the color of the converter layer. In particular, the color scattering layer is a white color scattering layer, i.e. brings about a white color impression. By way of example, other colors of the color scattering layer are provided: red, green, yellow, orange or blue.

Embodiments in respect of the method emerge in analogous fashion from embodiments in respect of the component, and vice versa. Correspondingly made explanations, specified advantages and technical features for the method emerge from the component, and vice versa.

According to one aspect, provision is made of an optoelectronic component which is a combination of the aforementioned optoelectronic components, once relating to the spacer and once without the spacer. Thus, that is to say that at least two light-emitting diodes are arranged on the carrier in this optoelectronic component, wherein the spacer is arranged on the luminous surface on the one light-emitting diode and no spacer is arranged on the other light-emitting diode. This is advantageous, in particular, if the light-emitting diodes e.g. have different heights. Hence, the spacer advantageously brings about an equalization of the different heights such that a plane surface, formed from the spacer surface, the potting compound surface and the one luminous surface, is possible despite the different heights. In particular, this advantageously facilitates arranging, firstly, a light-emitting diode which is electrically contacted from the upper side thereof and, secondly, another light-emitting diode which is electrically contacted from the lower side thereof on a carrier.

According to one embodiment, provision is made for the light-emitting diode to be formed as a light-emitting diode chip (LED chip). "LED" denotes "light-emitting diode".

According to one embodiment, a plurality of light sources are arranged on the carrier. In particular, the plurality of light sources have the same or, advantageously, a different embodiment.

According to one embodiment, a plurality of light-emitting diodes are provided, said light-emitting diodes, in particular, having the same or, advantageously, a different embodiment.

In one embodiment, provision is made for each light-emitting diode to be provided with a dedicated converter layer. That is to say that a converter layer is arranged in each case on the respective upper side of the diodes facing away from the surface of the carrier. That is to say, provision is made of a plurality of converter layers which are embodied separately from one another. This brings about, in particular, the technical advantage of being able to set a dedicated light conversion individually and efficiently for each diode.

Technical functionalities of embodiments including a light source and/or a light-emitting diode apply analogously to embodiments including a plurality of light sources and/or a plurality of light-emitting diodes.

According to one embodiment, the carrier is a leadframe. According to one embodiment, the potted component is a so-called QFN package. Here, "QFN" denotes "quad flat no leads". That is to say, in particular, the carrier is a QFN substrate.

That is to say, in particular, the light-emitting diode is embodied as a surface mounted component. The term "surface mounted device" (SMD) is also used.

In particular, the potting compound may also be referred to as a molding compound. In this respect, potting may, in particular, be denoted molding.

According to one embodiment, the potting compound includes titanium dioxide ($TiO_2$).

According to one embodiment, the color scattering layer includes titanium dioxide.

According to one embodiment, a layer thickness of the color scattering layer is between 1 μm and 40 μm.

According to one embodiment, a layer thickness of the converter layer is between 10 μm and 400 μm.

According to one embodiment, a thickness of the spacer is between 70 μm and 300 μm.

According to one embodiment, the spacer is a glass layer or a glass platelet.

According to one embodiment, the spacer is adhesively bonded to the luminous surface. That is to say, the spacer is adhesively bonded to the luminous surface according to one embodiment.

According to one embodiment, a light-emitting diode includes an upper side and a lower side lying opposite the upper side. By way of example, the lower side is arranged on the surface of the carrier. In general, the surface of the carrier may also be referred to as mounting surface. The luminous surface is situated on the upper side. In particular, a soldering pad for electrically contacting the diode is provided on the upper side.

BRIEF DESCRIPTION OF THE DRAWINGS

The above-described properties, features and advantages of the present disclosure and the manner in which they are achieved will become clearer and more easily understandable in conjunction with the following description of the exemplary embodiments which are explained in more detail in conjunction with the drawings.

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

FIGS. 1 to 7, 9 to 14 and 16 to 22 show lateral sectional views.

Figure 1:
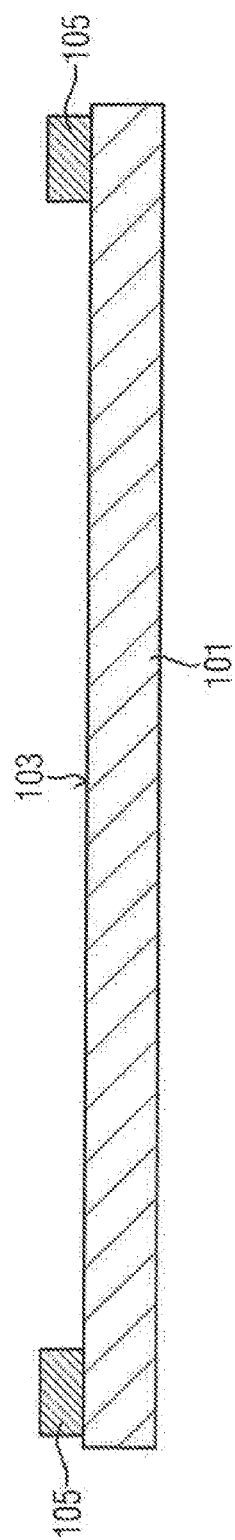
FIGS. 1-3 each show a different point in time during a method for producing an optoelectronic component, FIGS. 4-7 each show an optoelectronic component.

FIG. 1 shows a carrier 101 which, for example, is embodied as a QFN substrate. The carrier 101 includes a surface 103 which is used as mounting surface. Below, the mounting surface is likewise denoted by reference sign 103. Two protective diodes 105 are arranged on the mounting surface 103. These protective diodes 105 serve as a protection against electrostatic discharge for light-emitting diodes arranged on the mounting surface 103 (cf. the following figures).

Figure 2:
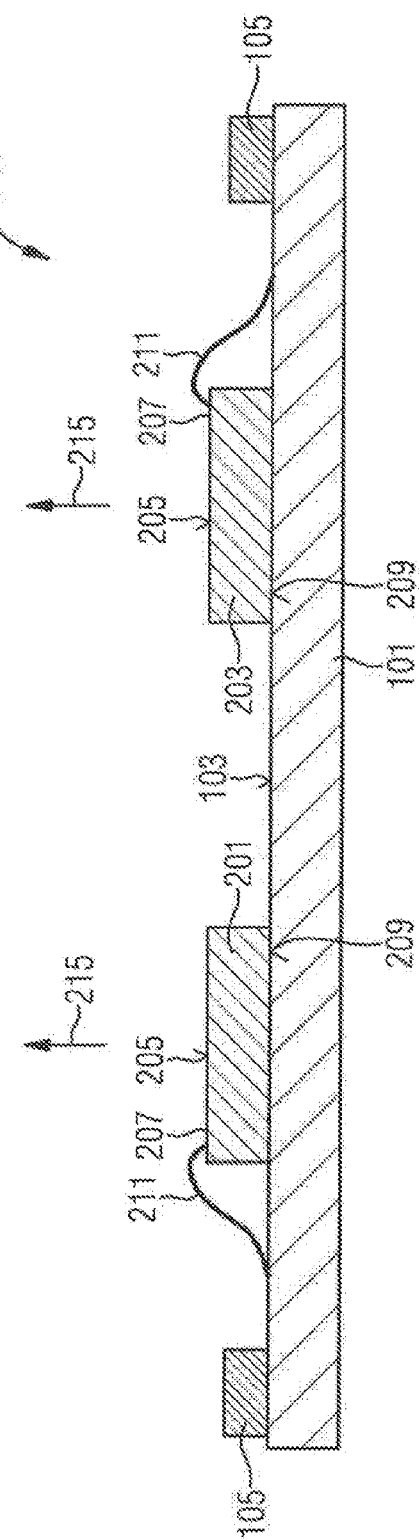

FIG. 2 now shows a carrier 101 including two light-emitting diodes 201 and 203 arranged on the mounting surface 103. The two light-emitting diodes 201 and 203 each include a luminous surface 205, from which light is emitted during operation of the light-emitting diode 201, 203. An emission direction of the emitted light is denoted symbolically by an arrow with the reference sign 215. For reasons of clarity, the symbolically depicted emission direction has not been drawn in each figure.

The light-emitting diodes 201, 203 each include an upper side 207 and a lower side 209 lying opposite the upper side 207. The lower side 209 is arranged on the mounting surface 103. The luminous surface 205 is situated on the upper side 207 of the respective light-emitting diode 201, 203.

A bond wire 211 which brings about an electrical connection between the mounting surface 103 and the upper side 207 is provided in each case for electrical contacting of the two light-emitting diodes 201, 203. It is noted that the electrical contacting by means of a bond wire 211 should merely be an electrical contact which is illustrated schematically. A person skilled in the art knows how a light-emitting diode is electrically contacted with a carrier 101 by bond wires 211.

The two light-emitting diodes 201, 203 form a light source 213.

Provision may be made of more than two or less than two light-emitting diodes 201, 203 in an embodiment not depicted here.

Figure 3:
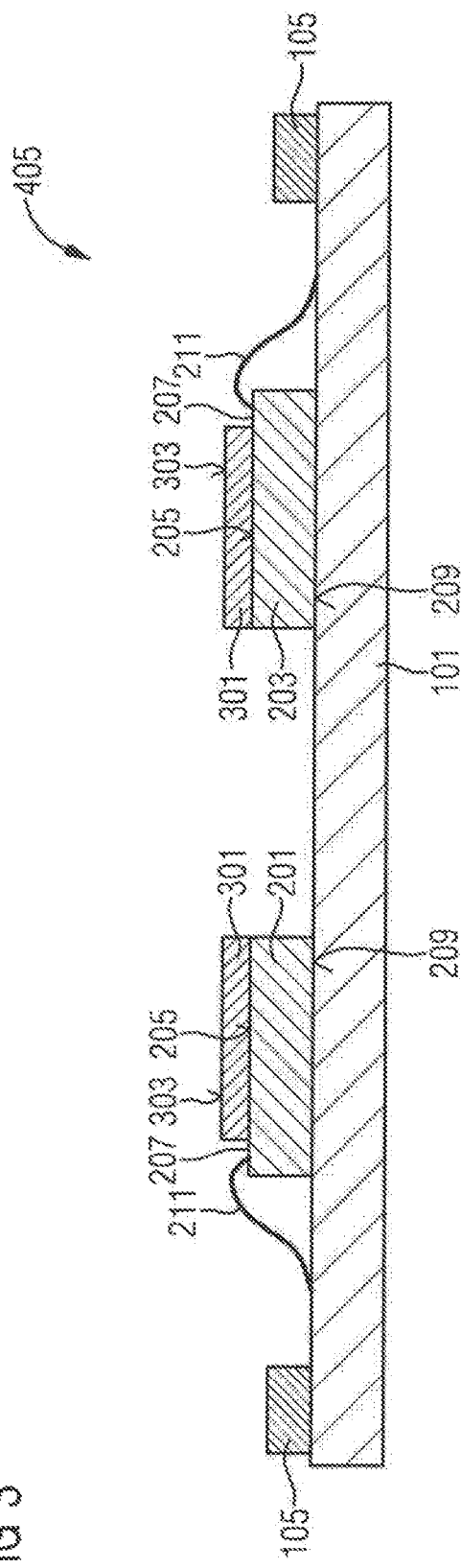

In FIG. 3, a spacer 301 is arranged on, for example adhesively bonded to, the luminous surface 205 of the respective diode 201, 203. The spacer 301 is transparent and converter-free. That is to say, the spacer 301 does not have a conversion function or a conversion property.

The spacer 301 includes a spacer surface 303 facing away from the luminous surface 205. Here, the spacer 301 does not cover the entire upper side 207 of the diodes 201, 203. Instead, room or space is kept free for the electrical contacting, in this case the bond wires 211. A distance is formed between the luminous surface 205 and the spacer surface 303 on account of the spacer 301. Here, a height of the spacer 301 is such that the spacer surface 303 projects beyond the bond wire 211. That is to say, the spacer surface 303 is arranged higher than a highest point of the bond wire 211 in relation to the mounting surface 103.

Figure 4:
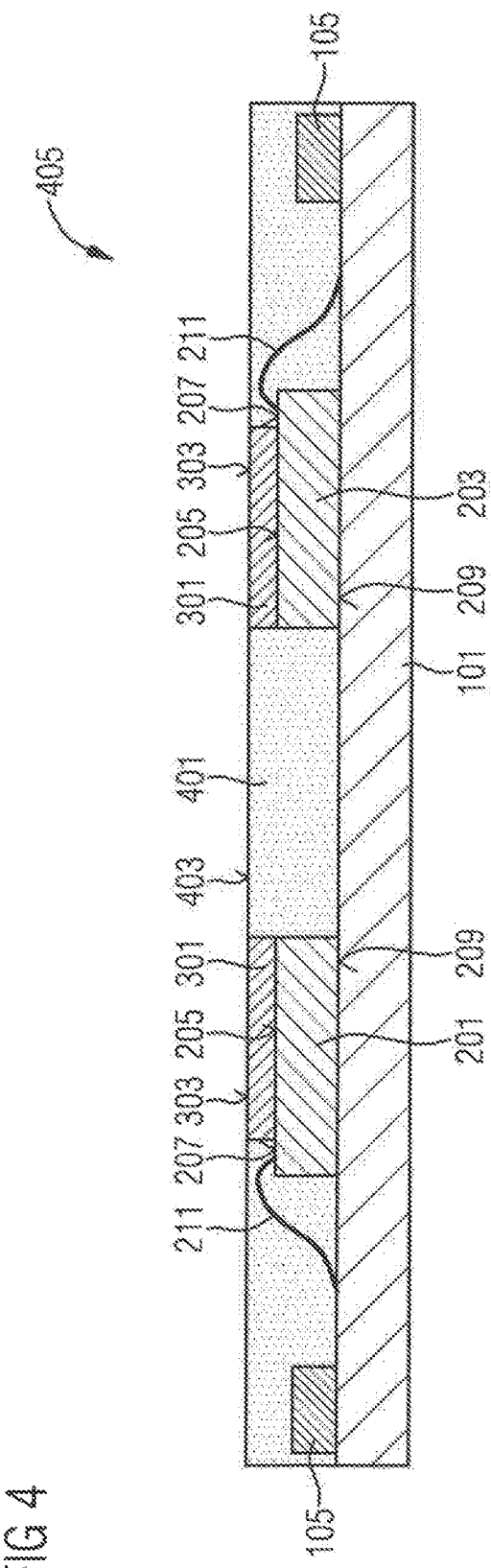

FIG. 4 now shows the arrangement in accordance with FIG. 3 after potting, in particular after potting in which an anti-adhesion film was used for a surface of the potting tool. The potting compound is denoted by reference sign 401. A potting compound surface facing away from the mounting surface 103 of the carrier 101 is denoted by reference sign 403. Potting is carried out in such a way that the spacer surface 303 extends flush with the potting compound surface 403, and so the surface formed by the potting compound surface 403 and by the spacer surface 303 is planar. As shown in FIG. 4, all electronic components arranged on the mounting surface 103 are potted by the potting compound 401. This brings about good mechanical protection of the electronic components.

The arrangement shown in FIG. 4 is denoted by reference sign 405 and represents an optoelectronic component according to one aspect of the present disclosure.

FIG. 5 shows the component 405 in accordance with FIG. 4, with two converter layers 501, 503 now being arranged on the surface. Here, the converter layer 501 is arranged on the surface in a manner covering the luminous surface 205 of the diode 201. The converter layer 503 is arranged on the surface in a manner covering the luminous surface 205 of the diode 203. The two converter layers 501, 503 have different embodiments such that they convert light emitted by the light-emitting diodes 201, 203 into different emission spectra. On account of the plane surface, there is no restriction in respect of the geometry and precise structure and form of the converter layers 501, 503, which restrictions otherwise emerge on account of the surface structure of the carrier 101 as a result of the individual electronic components arranged on the carrier 101. Thus, for example, no bond wire 211 interferes with an assembly of the converter layers 501, 503 anymore.

FIG. 6 shows a further embodiment of the optoelectronic component 405. In the embodiment shown in FIG. 6, a white color scattering layer 601 including e.g. titanium dioxide is applied or arranged on the converter layers 501, 503 and, in part, on the plane surface. By way of example, the color scattering layer 601 may be sprayed on. A white optical overall impression of the component 405 is brought about by way of the white color scattering layer 601. In particular, the individual components on the mounting surface 103 and the converter layers 501, 503 are at least partly hidden by the color scattering layer 601.

Figure 7:
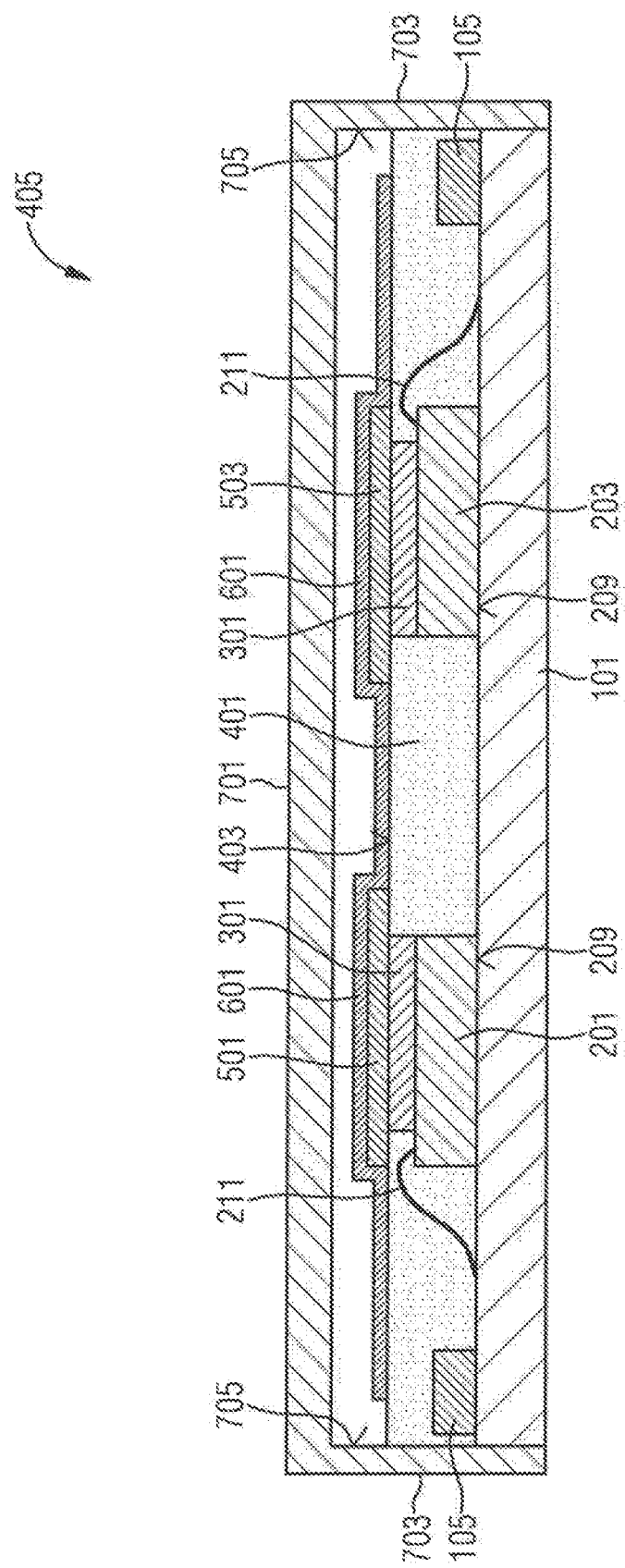

FIG. 7 shows the arrangement, i.e. the component 405, in accordance with FIG. 6 with a lens holder 701 including a lens not depicted here. Here, the lens holder 701 has a U-shape including two opposite limbs 703. The lens holder 701 is dimensioned in such a way that the carrier 101, with the sidewalls thereof, rests against the opposite inner sides of the limbs 703. This is the ideal case. As a rule, the lens holder is, in particular, slightly larger than the carrier on account of tolerances. Optical imaging of the emitted light is advantageously facilitated by means of the lens not depicted here.

Figure 8:
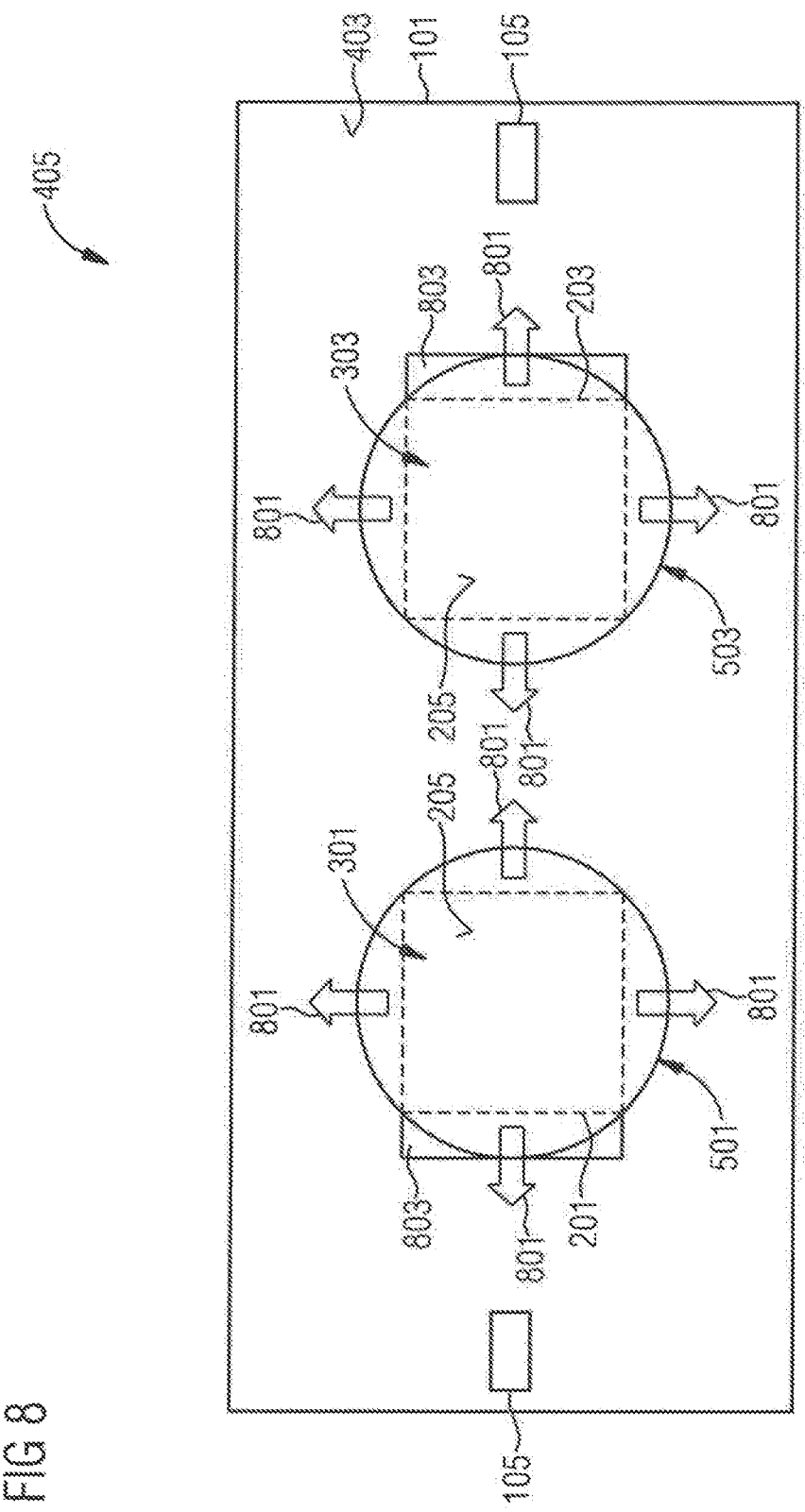
FIG. 8 shows a plan view of the optoelectronic component in accordance with FIG. 5, FIGS. 9 and 10 each show a point in time in a method for producing an optoelectronic component, FIGS. 11-14 each show an optoelectronic component.

FIG. 8 shows a plan view of the component 405 in accordance with FIG. 5.

Reference sign 801 shows arrows which symbolically indicate that, on account of the plane surface, the converter layers 501, 503 are scalable as desired in terms of the size, geometry and form thereof. Only the size of the component 405 limits the size of the converter layers 501, 503.

Reference sign 803 shows a region in which the bond wire 211 contacts the upper side 207. This region 803 is free from the spacer 301, i.e. it is not covered by the latter.

Figure 9:
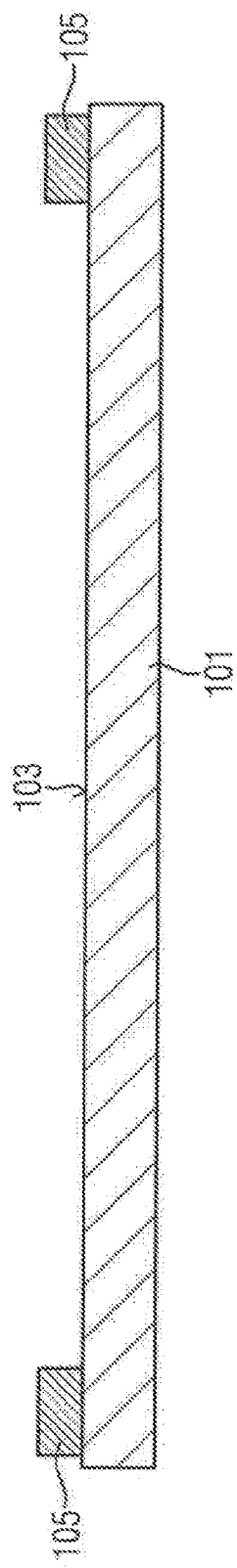
Figure 10:
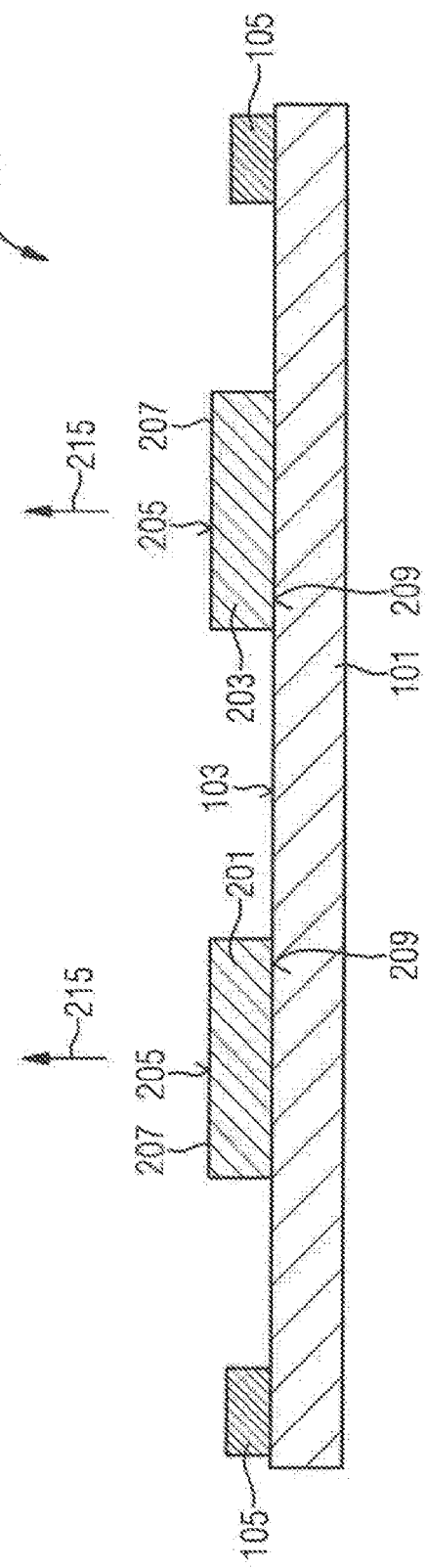

FIGS. 9 and 10 each show a point in time in a method for producing an optoelectronic component. The light-emitting diodes 201, 203 employed here are such that electrical contacting is brought about by way of the lower side 209 thereof. Thus, this means that bond wires 211 which form an electrical connection from the upper side 207 to the mounting surface 103 are no longer necessary. In particular, this results in the technical advantage of allowing a spacer 301 to be dispensed with. In this case, the potting compound surface 403 is then formed flush with the luminous surface 205 during potting. This is shown in FIG. 11. That is to say, the plane surface is formed in this case by means of the luminous surface 205 and by means of the potting compound surface 403. Therefore, the arrangement shown in FIG. 11 forms an optoelectronic component 1101 in accordance with a further aspect of the present disclosure.

FIGS. 12 to 14 each show a development of the optoelectronic component 1101 in accordance with FIG. 11. Here, analogously to FIG. 5, converter layers 501, 503 are arranged on the plane surface in FIG. 12. Analogously to FIG. 6, a white color scattering layer 601 is arranged, for example sprayed, on the converter layers 501, 503 and, in part, on the plane surface in FIG. 13. A lens holder 701 is provided in FIG. 14, analogously to FIG. 7.

Figure 15:
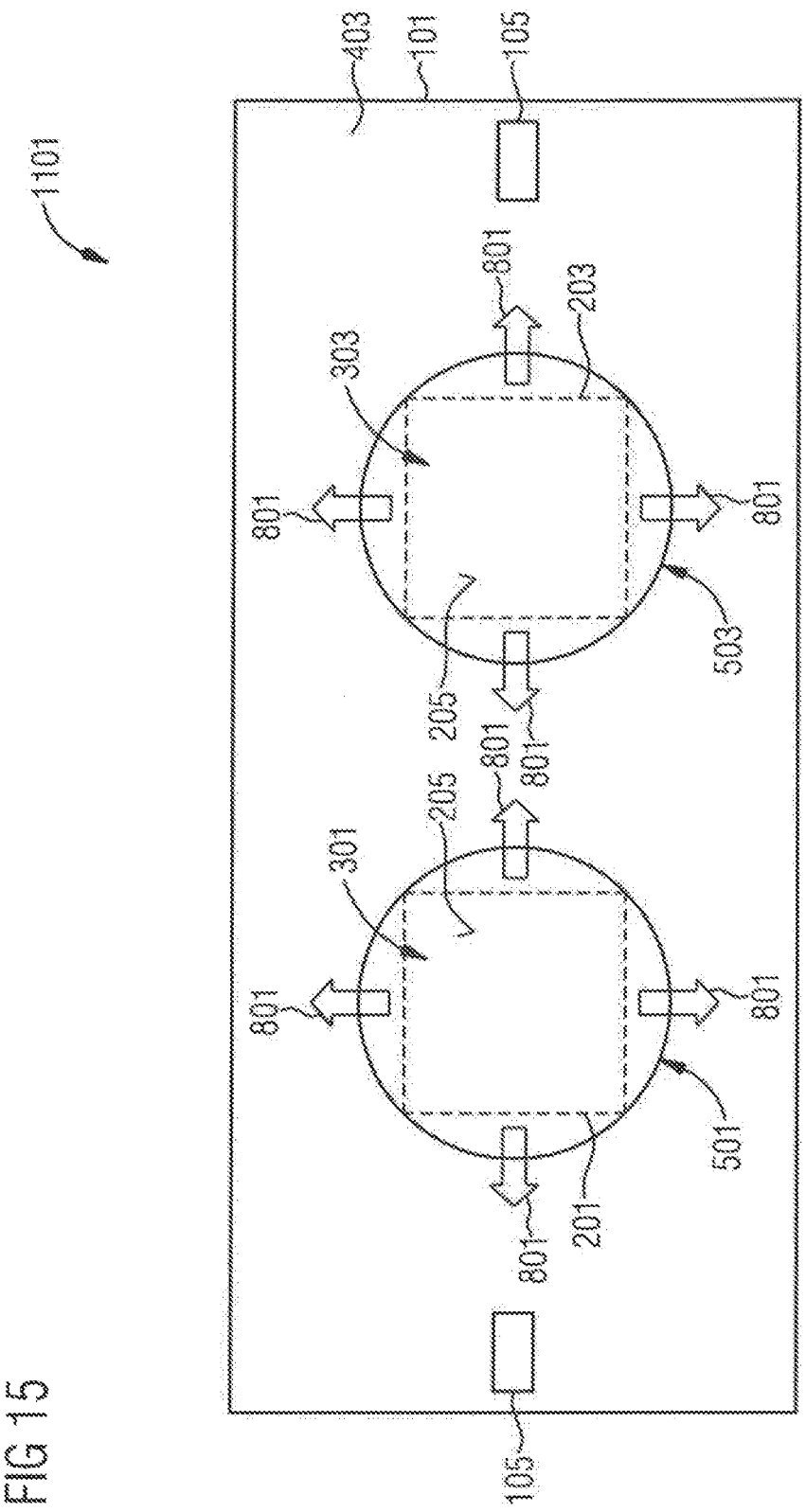
FIG. 15 shows a plan view of the optoelectronic component in accordance with FIG. 12, FIGS. 16-18 each show a point in time in a method for producing an optoelectronic component, FIGS. 19-22 each show an optoelectronic component.
Figure 22:
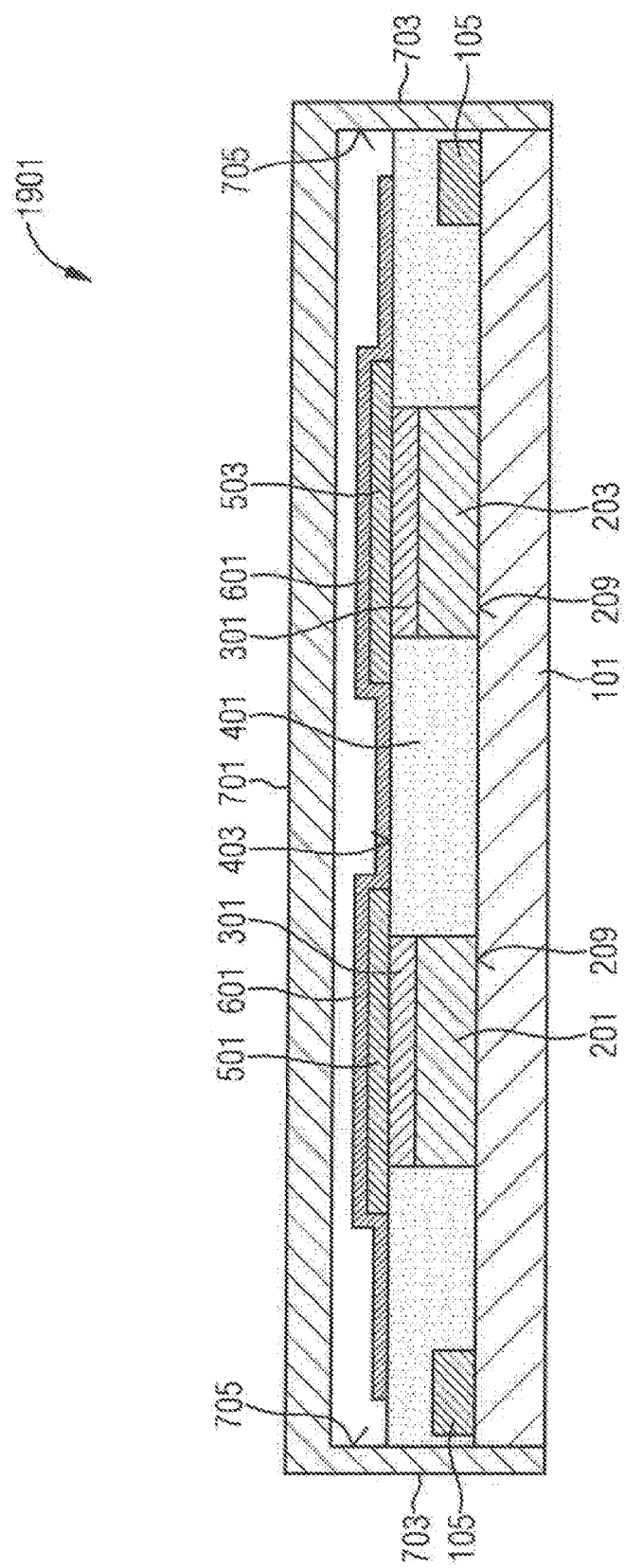
Figure 23:
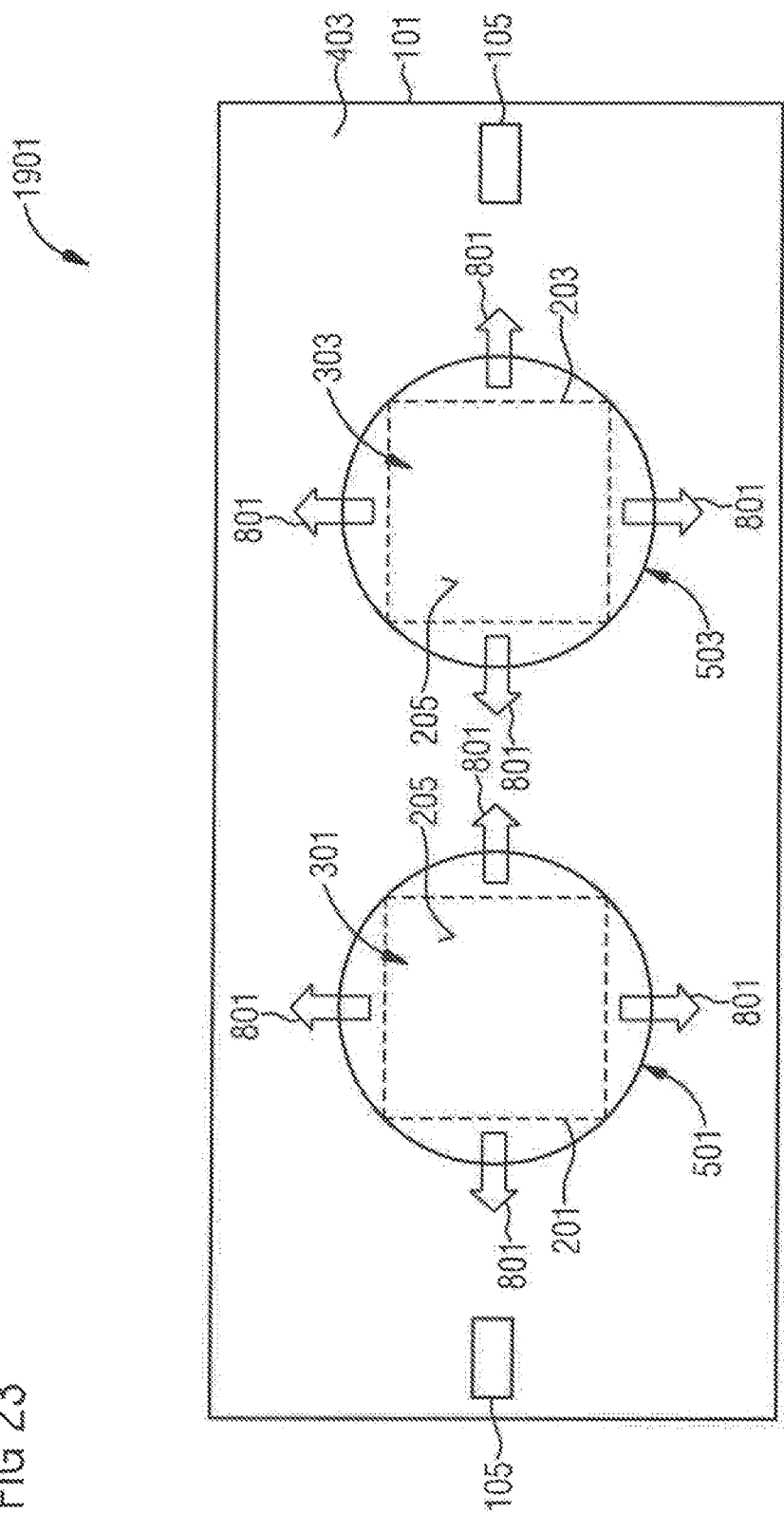
FIG. 23 shows a plan view of the optoelectronic component in accordance with FIG. 20.

FIG. 15 shows a plan view, analogous to FIG. 8, of the component 1101 in accordance with FIG. 12.

FIGS. 16 to 23 show analogous views which respectively correspond to FIGS. 1 to 8. In the arrangements shown in FIGS. 16 to 23, electrical contacting of the light-emitting diodes 201, 203 is likewise brought about from the lower side 209 thereof.

That is to say, this is analogous to FIGS. 9 to 15 and contrary to FIGS. 1 to 8. Nevertheless, in contrast to FIGS. 9 to 15, a spacer 301 is provided here, said spacer 301 now being arranged over the entire upper side 207. This is because bond wires 211 no longer interfere in this case and also do not take away any mounting space for the spacer 301. Then, the individual elements situated on the mounting surface 103 are potted in an analogous manner such that a plane surface on which converter layers and color scattering layers may be applied is formed.

Figure 24:
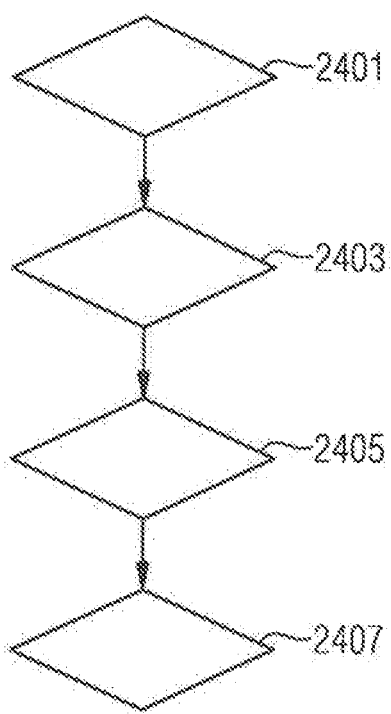
FIG. 24 shows a flowchart of a method for producing an optoelectronic component and FIG. 25 shows a flowchart of a further method for producing an optoelectronic component.

FIG. 24 shows a flowchart of a method for producing an optoelectronic component. The method includes the following steps:

Providing (2401) a carrier, arranging (2403) a light source on a surface of the carrier, wherein the light source includes at least one luminous surface formed by at least one light-emitting diode, arranging (2405) a transparent converter-free spacer on the luminous surface such that a distance is formed between the luminous surface and a spacer surface of the spacer facing away from the luminous surface, and potting (2407) the light source by means of a potting compound such that the spacer surface is formed extending flush with a potting compound surface facing away from the surface of the carrier and a plane surface is formed by the spacer surface and the potting compound surface.

Figure 25:
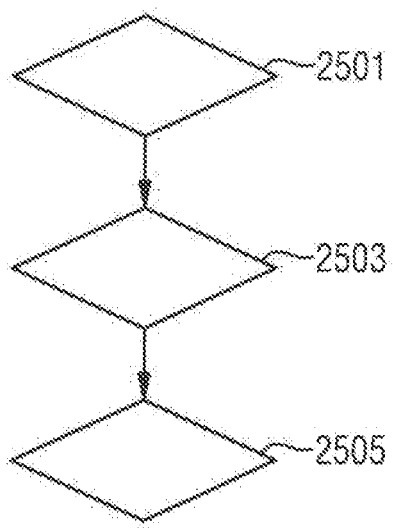

FIG. 25 shows a flowchart of another method for producing an optoelectronic component. The method includes the following steps:

Providing (2501) a carrier, arranging (2503) a light source on a surface of the carrier, wherein the light source includes at least one luminous surface formed by at least one light-emitting diode, and potting (2505) the light source by a potting compound such that a potting compound surface facing away from the surface of the carrier is formed extending flush with the luminous surface and a plane surface is formed by the luminous surface and the potting compound surface.

That is to say, in particular, the present disclosure includes the idea that the package, i.e. the optoelectronic component 405, with the potted elements thereof is plane on the upper side, i.e. forms a plane surface.

In one example, a transparent layer (construction element) is placed on the LEDs in each case. Said layer is used as the spacer 301 for the molding process. As a result, all components, such as e.g. wirebond, SMD components, may be hidden optically. Alternatively, provision is made, in particular, for dispensing with the layer when using a flip chip and directly molding the chip.

In one embodiment, a layer, e.g. the converter layer, is produced with the desired size and geometry (fancy designs are advantageously possible, such as e.g. logos, circles, stars etc.), for example by layer screen printing or layer molding. The layer is mounted on the (potted) upper side of the package, for example by adhesive bonding.

As a rule, the layer serves for light conversion and is mounted over the light-emitting surface of the chip. Naturally, according to one embodiment, provision is additionally made for the layer geometry to lie outside of the emitting surface. This serves, in particular, for the visual impression. An extreme example lies in, for example, masking a majority of the component with a conversion film/colored layer.

Optionally, provision is made, for example, for additionally applying $TiO_2$ over the layer (converter layer) by jetting or spray coating.

A substantial advantage of the present disclosure consists, in particular, in the flexibility and scalability of the layer, the geometry of the layer being freely selectable and not being restricted by the geometry of the chip or the wire bonds or the package walls (cavity).

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component comprising:
a carrier, and
a light source arranged on a surface of the carrier,
said light source comprising at least one luminous surface formed by at least one light-emitting diode, wherein
a transparent converter-free spacer is arranged on a partial surface of the luminous surface such that
a distance is formed between the luminous surface and a spacer surface of the spacer facing away from the luminous surface, and wherein
the light source and the spacer is potted up to the spacer surface by means of a potting compound such that the spacer surface is formed extending flush and level with a potting compound surface facing away from the surface of the carrier and a surface formed by means of the spacer surface and the potting compound surface is planar.

2. The optoelectronic component as claimed in claim 1, wherein a converter layer which leaves the luminous surface open is arranged on the surface.

3. The optoelectronic component as claimed in claim 1, wherein the spacer has an electrically insulating embodiment.

4. The optoelectronic component as claimed in claim 1, wherein the light-emitting diode is electrically contacted on an upper side facing away from the surface of the carrier and wherein the spacer projects beyond the electrical contacting.

5. The optoelectronic component as claimed in claim 1, wherein the spacer is a glass layer or a glass platelet.

6. The optoelectronic component as claimed in claim 1, wherein a converter layer at least partly covering the luminous surface is arranged on the surface.

7. The optoelectronic component as claimed in claim 6, wherein the converter layer is produced by means of screen printing or by means of potting.

8. The optoelectronic component as claimed in claim 6, wherein a color scattering layer for creating a color by scattering light at a color scattering layer surface of the color scattering layer facing away from the surface is arranged on the converter layer.

9. An optoelectronic component comprising:
a carrier, and
a light source arranged on a surface of the carrier,
said light source comprising at least one luminous surface formed by at least one light-emitting diode, wherein
the light source is potted up to the luminous surface by means of a potting compound such that a potting compound surface facing away from the surface of the carrier is formed extending flush and level with the luminous surface and a surface formed by means of the luminous surface and the potting compound surface is planar, wherein a converter layer at least partly covering the luminous surface is arranged on the surface and wherein a color scattering layer for creating a color by scattering light at a color scattering layer surface of the color scattering layer facing away from the surface is arranged on the converter layer.

10. The optoelectronic component as claimed in claim 9, wherein the converter layer is produced by means of screen printing or by means of potting.

11. The optoelectronic component as claimed in claim 9, wherein the color scattering layer comprises titanium dioxide.

12. The optoelectronic component as claimed in claim 9, wherein the color scattering layer has a layer thickness of between 1 µm and 40 µm.

13. A method for producing an optoelectronic component, comprising:
providing a carrier,
arranging a light source on a surface of the carrier, wherein the light source comprises at least one luminous surface formed by at least one light-emitting diode,
arranging a transparent converter-free spacer on a partial surface of the luminous surface such that a distance is formed between the luminous surface and a spacer surface of the spacer facing away from the luminous surface, and
potting the light source and the spacer up to the spacer surface by means of a potting compound such that the spacer surface is formed extending flush and level with a potting compound surface facing away from the surface of the carrier and a planar surface is formed by means of the spacer surface and the potting compound surface.

14. A method for producing an optoelectronic component, comprising:
- providing a carrier,
- arranging a light source on a surface of the carrier, wherein the light source comprises at least one luminous surface formed by at least one light-emitting diode,
- potting the light source up to the luminous surface by means of a potting compound such that a potting compound surface facing away from the surface of the carrier is formed extending flush and level with the luminous surface and a planar surface is formed by means of the luminous surface and the potting compound surface,
- arranging, on the planar surface, a converter layer at least partly covering the luminous surface, and
- arranging, on the converter layer, a color scattering layer for creating a color by scattering light at a color scattering layer surface of the color scattering layer facing away from the layer.

* * * * *